United States Patent [19]

Ohmi et al.

[11] Patent Number: 5,759,214
[45] Date of Patent: Jun. 2, 1998

[54] NITROGEN GAS SUPPLY SYSTEM

[75] Inventors: Tadahiro Ohmi, Miyagi; Yoshio Ishihara, Ibaraki, both of Japan

[73] Assignee: Nippon Sanso Corporation, Tokyo, Japan

[21] Appl. No.: 704,738

[22] PCT Filed: Jan. 8, 1996

[86] PCT No.: PCT/JP96/00010

§ 371 Date: Sep. 5, 1996

§ 102(e) Date: Sep. 5, 1996

[87] PCT Pub. No.: WO96/21945

PCT Pub. Date: Jul. 18, 1996

[30] Foreign Application Priority Data

Jan. 9, 1995 [JP] Japan .................................. 7-001125

[51] Int. Cl.$^6$ .................................................. C23C 16/00
[52] U.S. Cl. .......................... 29/25.01; 118/715; 118/719
[58] Field of Search ........................ 29/25.01; 118/715, 118/719; 137/208, 209

[56] References Cited

U.S. PATENT DOCUMENTS 5,256,204  10/1993  Wu ............................... 118/719
5,527,390  6/1996  Ono et al. ..................... 118/719

FOREIGN PATENT DOCUMENTS 48-38887  6/1973  Japan .
5-315431  11/1993  Japan .
6-151558  5/1994  Japan .

*Primary Examiner*—R. Bruce Breneman
*Assistant Examiner*—Jeffrie R. Lund
*Attorney, Agent, or Firm*—Armstrong, Westerman, Hattori, McLeland & Naughton

[57] ABSTRACT

A nitrogen gas supply system which can efficiently supply nitrogen gas to a wafer processing unit 31 for applying a predetermined processing to wafers and to a nitrogen gas tunnel type wafer conveyor 32 for transporting the wafers to the wafer processing unit 31 through a gate valve 37 in sufficient and necessary amounts and with sufficient and necessary purity levels, respectively. The nitrogen gas obtained supply system has a passage 38 for supplying high-purity nitrogen gas obtained in a cryogenic air separation plant 33 serving as a nitrogen gas generator to the wafer processing unit 31, a circulating passage 40 securing communication between outlet 32a and inlet 32b of the conveyor 32 via a purifier 39, and a replenishing passage 44 for replenishing nitrogen gas from a liquid nitrogen tank 36 to the circulating passage 40.

3 Claims, 2 Drawing Sheets ered by gas carried through conveyor 12 to wafer processing unit 11 when gate valve 20 is opened.

NITROGEN GAS SUPPLY SYSTEM

TECHNICAL FIELD

The present invention relates to a nitrogen gas supply system, more particularly to a system for supplying nitrogen gas to a wafer processing unit and to a wafer conveyor in a semiconductor producing apparatus.

BACKGROUND ART

In the field of semiconductor industry, nitrogen gas is consumed in huge amounts. Accordingly, these days, a nitrogen gas generator such as a cryogenic air separation plant is installed near the semiconductor producing apparatus so as to supply nitrogen gas generated by the nitrogen gas generator to each section.

FIG. 1 shows one example of prior art nitrogen gas supply system for supplying nitrogen gas to a wafer processing unit 11 and to a nitrogen gas tunnel type wafer conveyor (hereinafter simply referred to as conveyor) 12. A cryogenic air separation plant 13 is employed as the nitrogen gas generator. The cryogenic air separation plant 13 can relatively easily provide high-purity nitrogen gas to be suitably employed for treating semiconductors.

Feedstock air introduced through a passage 14 into the cryogenic air separation plant 13 is cooled by a heat exchanger 15, after compression and purification, and is introduced to a distillation column 16, where it is subjected to well-known condensation and fractionation treatments to generate nitrogen gas. After the thus formed nitrogen gas is allowed to resume substantially normal temperature by the heat exchanger 15, the nitrogen gas is allowed to flow through a passage 17 to be supplied through a passage 17a to the wafer processing unit 11 and through a passage 17b to the conveyor 12, respectively.

The wafer processing unit 11 is an apparatus for applying a predetermined processing to wafers so as to produce semiconductor products. Usually, a vacuum pump 18 is connected to the wafer processing unit 11 to provide a pressure lower than atmospheric pressure for wafer treatment. While consumption of nitrogen gas in this wafer processing unit 11 fluctuates depending on the operational state of the processing unit 11, the cryogenic air separation plant 13 is preferably operated such that the amount of nitrogen gas to be generated may be constant so as to ensure stable operation of the separation unit 13. Accordingly, the nitrogen gas to be fed from the cryogenic air separation plant 13 to the wafer processing unit 11 assumes an oversupply or undersupply state depending on the operational state of the wafer processing unit 11. Thus, in the oversupply state, the nitrogen gas generated by the cryogenic air separation plant 13 is partly liquefied and stored in a liquid nitrogen tank 19, whereas the liquid nitrogen in the liquid nitrogen tank 19 is gasified, in the undersupply state, to be introduced through the passage 17a to the wafer processing unit 11.

Meanwhile, the conveyor 12 Is a nitrogen gas levitating conveyor composed, for example, of a box-like tunnel and a perforated panel disposed in the tunnel to demarcate the internal space of the tunnel into an upper space and a lower space, and nitrogen gas is designed to be supplied to the space defined below the perforated panel to be jetted through openings of the panel in a predetermined direction to transport wafers placed on the perforated panel being levitated by the nitrogen gas.

The nitrogen gas supplied into the tunnel of the conveyor 12 is not only employed for the transportation of wafers but also is brought into contact with the wafers when jetted through the perforated panel to keep purity of the wafers. More specifically, the nitrogen gas brought into contact with the wafers protects the wafer surfaces from moisture and hydrocarbons. Although the tunnel constituents of the conveyor 12 may sometimes generate a gas causative of wafer contamination, such gas is carried away by the nitrogen gas.

The conveyor 12 and the wafer processing unit 11 are connected to each other via a gate valve 20 for wafer transference. This gate valve 20 is opened as necessary to pick up a wafer transported through the tunnel of the conveyor 12 using suitable pick-up means such as a vacuum chuck into the wafer processing unit 11. The wafers processed by the wafer processing unit 11 may be sometimes returned to the conveyor 12. The gate valve 20 is closed except on the occasions of wafer transference.

As described above, while nitrogen gas is supplied from the cryogenic air separation plant 3 to the conveyor 12, the nitrogen gas supplied through the tunnel inlet of the conveyor 12 is jetted through the perforated panel disposed in the tunnel and then discharged through the tunnel outlet to a passage 21. After the nitrogen gas is purified in a purifier 22, it is cooled by the heat exchanger 15 and then introduced directly to the distillation column 16. In the purifier 22, moisture and hydrocarbons contained in the nitrogen gas discharged from the conveyor 12 are removed.

Thus, since the nitrogen gas utilized in the conveyor 12 is fed back to the cryogenic air separation plant 13 to be circulated after purification, substantially no nitrogen gas is consumed in the conveyor 12, but the nitrogen gas is consumed only when the gate valve 20 is opened for wafer transference between the conveyor 12 and the wafer processing unit 11 to let the nitrogen gas flow through the gate valve 20 into the wafer processing unit operated under a low pressure.

Accordingly, nitrogen gas may be generated afresh in the cryogenic air separation plant 13 in an amount corresponding to the portion to be consumed in the wafer processing unit 11 plus the portion flowing from the conveyor 12 into the wafer processing unit 11 when the gate valve 20 is opened.

As described above, in the conventional nitrogen gas supply system, the nitrogen gas generated by the cryogenic air separation plant 13 is designed to be supplied to the wafer processing unit 11 and to the conveyor 12, and the exhaust gas of the nitrogen gas supplied to the conveyor 12 is designed to be fed back via the purifier 22 to the distillation column 16 of the cryogenic air separation plant 13. Therefore, in addition to the nitrogen gas generated afresh, the nitrogen gas fed back from the conveyor 12 must be treated in the distillation column 16. Meanwhile, the amount of nitrogen gas to be circulated to the conveyor 12 is frequently greater than that to be consumed in the wafer processing unit 11.

To describe specifically by giving a typical example, provided that consumption of nitrogen gas in the wafer processing unit 11 is 6,000 m³/h, the amount of nitrogen gas flowing through the conveyor 12 is 24,000 m³/h and the outflow of nitrogen gas through the gate valve 10 is 1 m³/h, the amount of nitrogen gas actually consumed amounts to 6,001 m³/h. Although the cryogenic air separation plant 13 may generate afresh 6,001 m³/h of nitrogen gas, substantially all of the nitrogen gas flowed through the conveyor 12 (24,000 m³/h) is fed back to the distillation column 16, so that the distillation column 16 must be of such a size as to provide capacity required for generating about 30,000 m³/h of nitrogen gas.

Further, while content of any impurity is required to be reduced to 0.1 ppb or less in the wafer processing unit 11, presence of moisture and hydrocarbons in an amount of about 1 ppb is permitted in the conveyor system even in the severest cases. However, since nitrogen gas is supplied from the single cryogenic air separation plant 13 to the wafer processing unit 11 and to the conveyor 12 in the prior art system, the purity of nitrogen gas to be supplied must satisfy the level as required in the wafer processing unit 11. In order to generate such very high-purity nitrogen in the cryogenic air separation plant 13, the amount of exhaust gas increases, leading to further increase in the size of the separation unit 13, and thus over-purity nitrogen gas is supplied to the conveyor 12.

DISCLOSURE OF THE INVENTION

It is an objective of the present invention to provide a nitrogen gas supply system which can efficiently supply nitrogen gas in sufficient and necessary amounts and with sufficient purity levels to a wafer processing unit and to a nitrogen gas tunnel type wafer conveyor, respectively.

The present invention provides a nitrogen gas supply system having a nitrogen gas generator and a nitrogen tank, which supplies nitrogen gas to a wafer processing unit for applying a predetermined processing to wafers and to a nitrogen gas tunnel type wafer conveyor for transporting the wafers to the wafer processing unit through a gate valve; wherein the system further comprises a passage for supplying nitrogen gas generated by the nitrogen gas generator to the wafer processing unit, a nitrogen gas circulating passage securing communication between an outlet and an inlet of the conveyor via a purifier, and a replenishing passage for replenishing nitrogen gas from the nitrogen tank to the circulating passage.

Since the nitrogen gas supply system according to the present invention is provided with an equipment for supplying high-purity nitrogen gas to the wafer processing unit in which a substantially fixed amount of nitrogen gas is consumed and also with an equipment for purifying nitrogen gas to be circulated in a great amount to the conveyor, and since an amount of nitrogen gas corresponding to the very small amount of nitrogen gas flowing out of the conveyor is adapted to be replenished from the nitrogen gas for the wafer processing unit, the initial cost and running cost can be reduced on a great margin.

Meanwhile, since the nitrogen gas generator may be allowed to have a size corresponding to the amount of nitrogen gas to be supplied to the wafer processing unit, the nitrogen gas generator can be downsized compared with the conventional generator, so that the useless feeding of extra high quality nitrogen gas to the conveyor can be avoided. Incidentally, while a cryogenic air separation plant which can relatively easily give high-purity nitrogen gas required in the wafer processing unit can be suitably employed as the nitrogen gas generator, other nitrogen generators such as a pressure swing adsorption unit and a diaphragm separation unit may be employed. Alternatively, a container charged with high-pressure nitrogen gas may be employed.

The purifier to be disposed in the nitrogen gas circulating passage may have a capacity of providing a nitrogen gas purity level required in the conveyor, so that the purifier can be simplified compared with that for obtaining high-purity nitrogen gas to be supplied to the processing unit. Further, the loss of nitrogen gas flowing out of the conveyor through the gate valve can be easily replenished by utilizing a part of nitrogen obtained in the nitrogen gas generator and stored in the nitrogen tank.

Furthermore, the control valve disposed in the replenishing passage can introduce a predetermined amount of nitrogen gas into the circulating passage with no loss. Further, use of the cryogenic air separation type purifier can achieve full and easy removal of moisture and hydrocarbons.

The nitrogen gas tunnel type wafer conveyor is not limited to the nitrogen gas levitating conveyor, but includes various types of conveyors which can maintain the wafer transportation environment in a nitrogen gas atmosphere, for example, a belt conveyor and magnetic conveyor.

BEST MODE FOR CARRYING OUT THE INVENTION

One embodiment of the present invention will be described in detail referring to FIG. 2.

Figure 1:
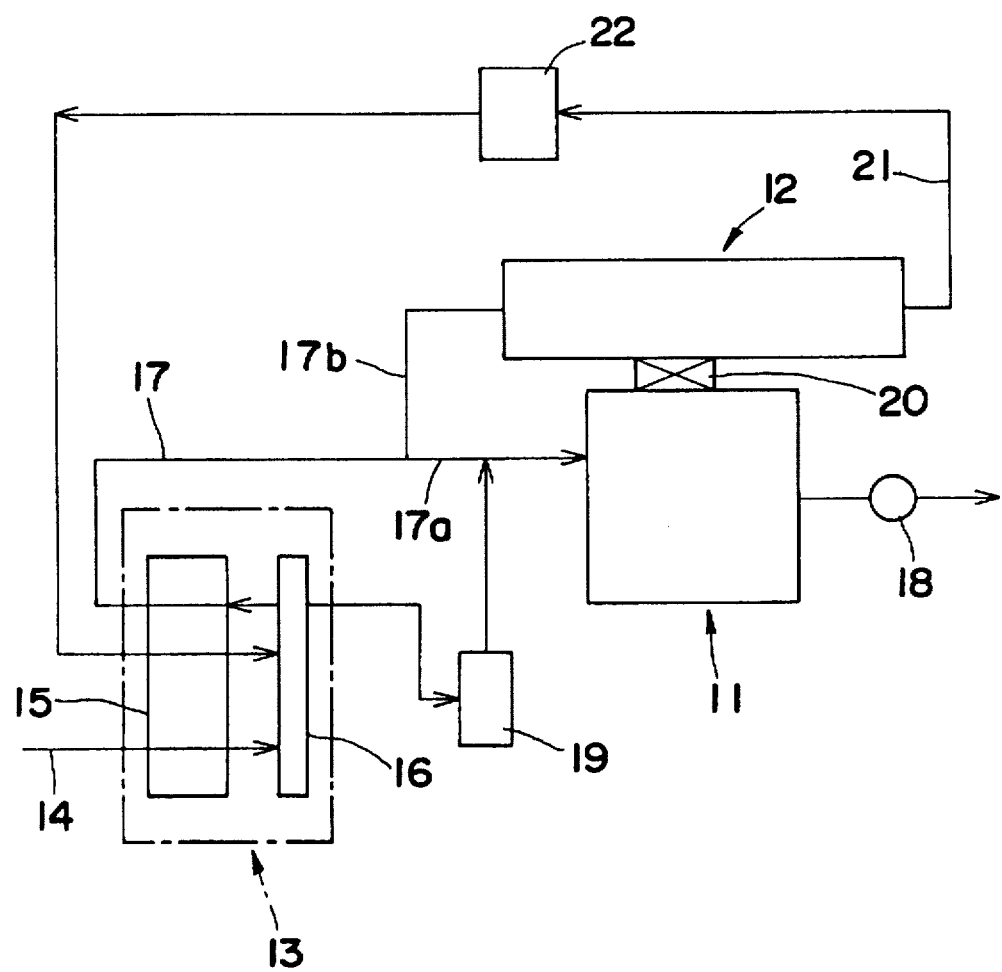
FIG. 1 is a schematic diagram showing an example of prior art nitrogen gas supply system.

It should be appreciated that a wafer processing unit 31, a conveyor (nitrogen gas tunnel type wafer conveyor) 32, a cryogenic air separation plant 33 as the nitrogen gas generator, a passage 34, a vacuum pump 35, a liquid nitrogen tank 36 and a gate valve 37 in this embodiment correspond to the wafer processing unit 11, the conveyor 12, the cryogenic air separation plant 13, the passage 14, the vacuum pump 18, the liquid nitrogen tank 19 and the gate valve 20 in FIG. 1, respectively.

Figure 2:
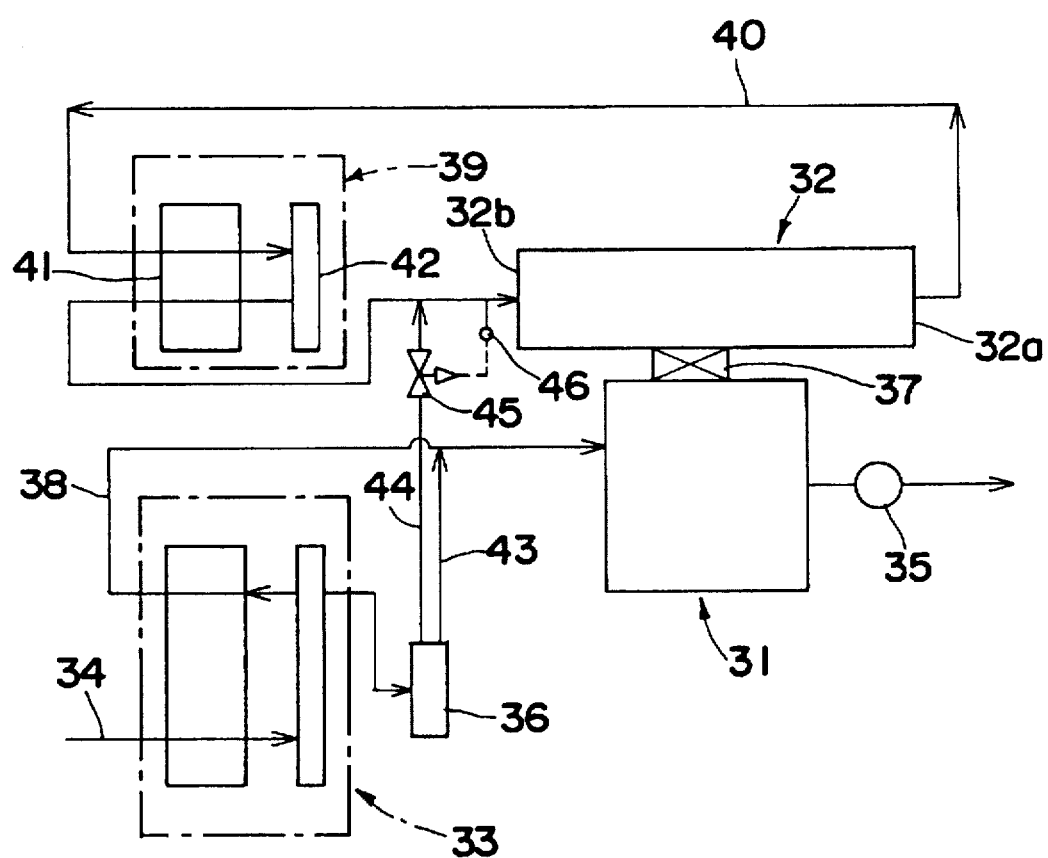
FIG. 2 is a schematic diagram showing an embodiment of the nitrogen gas supply system according to the present invention.

Although a single wafer processing unit 31 is connected to the conveyor 32 in FIG. 2, a plurality of wafer processing units 31 are usually connected to an actual conveyor.

A passage 38 is provided between the cryogenic air separation plant 33 and the wafer processing unit 31, and the substantial part of high-purity nitrogen gas obtained in the cryogenic air separation plant 33 is supplied through the passage 38 to the wafer processing unit 31, while the rest of nitrogen gas is liquefied and stored in the liquid nitrogen tank 36.

The conveyor 32 has a circulating passage 40 securing communication between a tunnel outlet 32a and a tunnel inlet 32b via a purifier 39, and the nitrogen gas discharged through the outlet 32a is purified in the purifier 39 and introduced again through the inlet 32b.

The purifier 39 is a low temperature separation type purifier provided with a heat exchanger 41, a distillation column 42, etc. and separates impurities from nitrogen gas by condensational purifying procedures to purify the nitrogen gas to a level required in the conveyor 32. Incidentally, while it is possible to employ an adsorption purifier or a diaphragm purifier as the purifier, the cryogenic air separation type purifier is preferred so as to efficiently remove moisture, hydrocarbons, etc. contained in the nitrogen gas discharged from the conveyor 32.

A passage 43 is provided between the liquid nitrogen tank 36 and the passage 38. The liquid nitrogen in the liquid nitrogen tank 36 is gasified when the amount of nitrogen gas to be supplied from the cryogenic air separation plant 33 through the passage 38 to the wafer processing unit 31 becomes insufficient depending on the operational state of the wafer processing unit 31, and the gasified nitrogen is supplied to the wafer processing unit 31.

Further, a replenishing passage 44 is provided between the liquid nitrogen tank 36 and the circulating passage 40 to replenish nitrogen gas from the liquid nitrogen tank 36 to the circulating passage 40. This replenishing passage 44 has a flow control valve 45 which controls the amount of nitrogen gas to be replenished depending on the pressure on the outlet side of the purifier 39 in the circulating passage 40. The valve travel of this flow control valve 45 is controlled by a pressure indicating controller 46 which detects the pressure in the circulating passage 40.

Accordingly, any pressure drop in the circulating passage 40 when the gate valve 37 is opened to let the nitrogen gas in the conveyor 32 flow into the wafer processing unit 31 is detected by the pressure indicating controller 46, and the valve travel of the flow control valve 45 is automatically controlled to supply a predetermined amount of nitrogen gas to the circulating passage 40.

Thus, fluctuation in the flow rate of nitrogen gas in the purifier 39 can be minimized by automatically replenishing nitrogen gas to maintain the pressure in the circulating passage 40 under a substantially fixed level, so that the purifier 39 can be operated stably. Incidentally, the flow control valve may be omitted, and a fixed amount of nitrogen gas may be adapted to be supplied continuously from the liquid nitrogen tank 36 to the circulating passage 40; whereas a valve which opens and closes interlocking with the gate valve 37 may be disposed in the replenishing passage 44.

As described above, in the nitrogen gas supply system of this embodiment, since the loss of nitrogen gas, flowed out from the conveyor 32 into the wafer processing unit 31 when the gate valve 37 is opened, is replenished from the liquid nitrogen tank 36 through the replenishing passage 44 to the circulating passage 40, the cryogenic air separation plant 33 may generate an amount of nitrogen gas corresponding to the portion to be consumed in the wafer processing unit 31 plus the portion flowing out of the conveyor 32 into the wafer processing unit 31. Accordingly, the cryogenic air separation plant 33 to be installed, in the typical example described above, may be of a capacity such that it can generate afresh nitrogen gas at a rate of 6,001 m³/h, and thus the size of the cryogenic air separation plant 33 can be reduced on a great margin compared with the conventional unit which generates nitrogen gas at a rate of 30,000 m³/h.

Since the purifier 39 for circulatory nitrogen gas disposed in the circulating passage 40 may purify nitrogen gas to a level required in the nitrogen gas to be used in the conveyor 32, it is possible to employ a cryogenic air separation plant having a simplified structure compared with the conventional unit which generates nitrogen gas to be supplied to the wafer processing unit 31.

Accordingly, even by use of two cryogenic air separation plants, the entire system can be downsized and simplified compared with the case where a single large nitrogen generator of the prior art for generating high-purity nitrogen is employed, and thus not only the facility cost but also the running cost can be reduced.

Incidentally, the cryogenic air separation plant may be of any constitution so long as nitrogen gas having a desired purity can be obtained. Meanwhile, while the liquid nitrogen in the liquid nitrogen tank is gasified to be employed as the supplementary nitrogen gas, nitrogen can be stored in the gaseous form.

We claim:

1. A nitrogen gas supply system having a nitrogen gas generator and a nitrogen tank, which supplies nitrogen gas to a wafer processing unit for applying a processing to wafers and to a nitrogen gas tunnel type wafer conveyor for transporting said wafers to said wafer processing unit through a gate valve;

wherein said system further comprises a passage for supplying nitrogen gas generated by said nitrogen gas generator to said wafer processing unit, a nitrogen gas circulating passage securing communication between an outlet and an inlet of said nitrogen gas tunnel type wafer conveyor via a purifier, and a replenishing passage for replenishing nitrogen gas from said nitrogen tank to said circulating passage.

2. The nitrogen gas supply system according to claim 1, wherein said replenishing passage has a control valve for controlling the amount of nitrogen gas to be replenished depending on the pressure on the outlet side of the purifier in the circulating passage.

3. The nitrogen gas supply system according to claim 1, wherein said purifier is a cryogenic separation type purifier.

* * * * *